(12) United States Patent
Guo et al.

(10) Patent No.: US 11,579,322 B2
(45) Date of Patent: Feb. 14, 2023

(54) SYSTEM AND METHOD FOR EARTHQUAKE RISK MITIGATION IN BUILDING STRUCTURES

(71) Applicant: KINETICA DYNAMICS INC., Toronto (CA)

(72) Inventors: Wen Wei Jack Guo, Toronto (CA); Constantin Christopoulos, Toronto (CA); Deepak Raj Pant, Toronto (CA); Michael Stewart Montgomery, Toronto (CA)

(73) Assignee: KINETICA DYNAMICS INC., Toronto (CA)

( * ) Notice: Subject to any disclaimer, the term of this patent is extended or adjusted under 35 U.S.C. 154(b) by 794 days.

(21) Appl. No.: 16/469,333

(22) PCT Filed: Dec. 13, 2017

(86) PCT No.: PCT/CA2017/051513
§ 371 (c)(1),
(2) Date: Jun. 13, 2019

(87) PCT Pub. No.: WO2018/107292
PCT Pub. Date: Jun. 21, 2018

(65) Prior Publication Data
US 2020/0025957 A1 Jan. 23, 2020

Related U.S. Application Data

(60) Provisional application No. 62/434,083, filed on Dec. 14, 2016.

(30) Foreign Application Priority Data

Dec. 14, 2016 (CA) .................. CA 2951421

(51) Int. Cl.
*G01V 1/30* (2006.01)
*G06F 30/13* (2020.01)
*E04H 9/02* (2006.01)

(52) U.S. Cl.
CPC ................. *G01V 1/30* (2013.01); *E04H 9/02* (2013.01); *G06F 30/13* (2020.01)

(58) Field of Classification Search
CPC .. G01V 1/30; E04H 9/02; G06F 30/13; G06Q 50/08
See application file for complete search history.

(56) References Cited

U.S. PATENT DOCUMENTS

2005/0049962 A1* 3/2005 Porter .................. G06Q 40/025
705/38
2006/0041406 A1* 2/2006 Porter .................. G06Q 10/063
703/2

(Continued)

FOREIGN PATENT DOCUMENTS

JP 2003-155776 5/2003
JP 2003155776 A * 5/2003

OTHER PUBLICATIONS

International Search Report PCT/CA2017/051513, dated Mar. 21, 2018.

*Primary Examiner* — Manuel A Rivera Vargas
*Assistant Examiner* — Yaritza H Perez Bermudez
(74) *Attorney, Agent, or Firm* — Elan IP Inc.

(57) ABSTRACT

A method for seismic loss assessment including receiving by a computer system computer-readable input data regarding a seismic hazard and building conditions, generating by the computer system one or more mitigation options and for each of the mitigation options, configuring the computer system to: determine a structural response, determine damage states from the structural response, determine an outcome of each of the damage states; and, output a representation (Continued)

tation of each of the outcomes for each of the damage states. The output is used in a seismic risk mitigation plan and/or design for one or more building structures.

18 Claims, 11 Drawing Sheets

(56) References Cited

U.S. PATENT DOCUMENTS

| | | | |
|---|---|---|---|
| 2011/0196810 A1* | 8/2011 | Bertogg | G06Q 40/08 705/36 R |
| 2018/0336652 A1* | 11/2018 | Wani | G06Q 10/06375 |
| 2020/0025957 A1* | 1/2020 | Guo | G06F 30/13 |

* cited by examiner

SYSTEM AND METHOD FOR EARTHQUAKE RISK MITIGATION IN BUILDING STRUCTURES

FIELD OF THE INVENTION

The invention relates generally to systems and methods for mitigating earthquake damage risk in building structures, particularly high-rise building structures.

BACKGROUND

The state-of-practice in seismic mitigation design is a building code-based prescriptive procedure that targets the life safety of occupants. Buildings are designed to a specific code, which is dictated by governmental or quasi-governmental authorities. While safety of occupants is essential, it is often insufficient for protecting properties and businesses against earthquake risk as damage to property and loss of building functions are all expected outcomes of code-based seismic design. Thus, in areas where building code is not enforced (i.e. existing buildings), stakeholders are often not motivated to invest in seismic upgrades due to the unclear connection between investment and risk mitigation. For owners and stakeholders of buildings in earthquake-prone locations, the earthquake risk is a multifaceted quantity that can be measured by dollar loss, downtime, death and injury and other relevant impact indices that are meaningful to the stakeholder's interest. Often, these impact indices can be evaluated if the extent of the damage to buildings and the contents that support the normal operations are known. Furthermore, having a building-specific guide map that relates relevant numeric impact indices to a complete range of feasible risk mitigation options facilitates informed decision-making and the establishment of business cases for the reduction of seismic risk.

Currently, there are two types of existing methods that evaluate property seismic risk outside of the scope of the building code. The mainstream catastrophe risk models (CAT models) used for seismic risk assessment of buildings and portfolio of buildings calculate the probability of reaching a general damage state (i.e. lightly damaged, moderately damaged or severely damaged) based on general building attributes (i.e. year built, type of construction material, location) through a statistical correlation analysis. Although it is straightforward to perform parametric analysis with a CAT model to compute the impact by inputting different combinations of building attributes, these global analyses are more appropriate for evaluating average impacts of large portfolios. They are generally insufficient for generating reliable assessments of the actual risk exposure and identifying risk mitigating options for specific buildings as they do not differentiate buildings based on their actual occupancy, structural system, contents and non-structural elements.

On the other hand, recently emerging building-specific risk assessment procedures that explicitly model the structural and non-structural damages is much more reliable for predicting the seismic risk for a given property, and allows a designer to evaluate earthquake financial and downtime impacts. However, such a procedure provides only passive assessment for conventional construction types, and must rely on an iterative analysis-redesign procedure, usually based on the building code, to achieve risk mitigation goals, which cannot be practically done for many different options in a design office because it is cost-prohibitive. These models rely on a specific, known building design. To apply such models and methods to the design phase itself would require computer processing and design resources that are impractical, as a full design of each modification to a building design must be simulated and put through an earthquake analysis.

There is accordingly a need in the art for an improved system and method for earthquake risk mitigation and/or assessment.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method for seismic loss assessment including. The method also includes receiving by a computer system computer-readable input data regarding a seismic hazard and building conditions. The method also includes generating by the computer system one or more mitigation options; for each of the mitigation options, configuring the computer system to: determine a structural response; determine damage states from the structural response; determine an outcome of each of the damage states; and, output a representation of each of the outcomes for each of the damage states; using the output representation in a seismic risk mitigation design for one or more building structures. Other embodiments of this aspect include corresponding computer systems, apparatus, and computer programs recorded on one or more computer storage devices, each configured to perform the actions of the methods. For the purposes of this description, it is noted that mitigation options includes the base case of the building without any actual or proposed mitigation modifications.

Implementations may include one or more of the following features. The method where the representation of each of the outcomes includes a data representation of risk quantifiers. The method where the computer system is further configured to output at least one risk mitigation guide map summarizing an effect of each of the risk quantifiers for each the one or more building structures. The method further including calculating and storing cost and design data points for each of the mitigation options and relating the risk identifiers to the cost and design data points for the using step. The method where the step of generating one or more mitigation options includes generating a range of feasible building properties and generating representative structural attributes of risk mitigation options. The method where the computer system configured to determine a structural response includes a configuration to determine primary engineering demand parameters and to calculate secondary engineering demand parameters conditional on the primary engineering demand parameters. The method where the determination of primary engineering demand parameters is determined by best-fit using unconstrained probabilistic distributions. The method where the computer system configured to determine a damage state for the structural response includes a configuration to determine a damage state for a plurality of components within the building structure; and the configuration to determine the outcome of each damage state considers the damage state of each of the plurality of components. The method where mitigation options are selected from the group including of auxiliary energy dissipation devices, seismic isolation, rocking mechanisms, building ductility enhancements, building element strengthening or weakening, building element stiffening and combinations thereof. The method where the representation of each of the outcomes includes a representation of one or more of financial loss, operational downtime, injury, death, and combinations of these over period of interest. The method further including, prior to the receiving step, obtaining data on a building site and condition of a building. The method where obtaining data on a building site includes conducting a site inspection and soil study to determine geological hazards and providing the geological hazards as the seismic hazards. The method where the input data is provided in a single file containing a description of building attributes. The method further including repeating the method steps for a plurality of buildings within a building portfolio. The method further defining mitigation plans for each building in the portfolio, and determining risk quantifiers for a plurality of time segments for each building in the portfolio. The method further including determining a total risk by summing the risk quantifiers for each time segment. The method further including outputting a representation of the total risk. Implementations of the described techniques may include hardware, a method or process, or computer software on a computer-accessible medium.

One general aspect includes a system for seismic loss assessment including. The system also includes computer-readable input data regarding a seismic hazard. The system also includes a computer system for generating one or more mitigation options. The system also includes the computer system configured to, for each of the mitigation options, determine a structural response; determine damage states from the structural response; determine an outcome of each of the damage states; and, output a representation of each of the outcomes for each of the damage states. Other embodiments of this aspect include corresponding computer systems, apparatus, and computer programs recorded on one or more computer storage devices, each configured to perform the actions of the methods.

Implementations may include one or more of the following features. The system where the representation of each of the outcomes includes a data representation of risk quantifiers. The system where the computer system is further configured to output at least one risk mitigation guide map summarizing an effect of each of the risk quantifiers for each the one or more building structures. The system where the computer system is further configured to calculate and store on a computer readable medium cost and design data points for each of the mitigation options and to relate the risk identifiers to the cost and design data points. The system where the generating one or more mitigation options includes generating a range of feasible building properties and generating representative structural attributes of risk mitigation options. The system where the computer system configured to determine a structural response includes a configuration to determine primary engineering demand parameters and to calculate secondary engineering demand parameters conditional on the primary engineering demand parameters. The system where the computer system configured to determine a damage state for the structural response includes a configuration to determine a damage state for a plurality of components within the building structure; and the configuration to determine the outcome of each damage state considers the damage state of each of the plurality of components. The system where the determination of primary engineering demand parameters is determined by best-fit using unconstrained probabilistic distributions. The system where mitigation options are selected from the group including of auxiliary energy dissipation devices, seismic isolation, rocking mechanisms, building ductility enhancements, building element strengthening or weakening, building element stiffening and combinations thereof. The system where the representation of each of the outcomes includes a representation of one or more of financial loss, operational downtime, injury, death, and periods of interest. The system where the computer system is further configured to receive data obtained on a building site and data regarding the condition of a building. The system where data on a building site includes data obtained by conducting a site inspection and soil study to determine geological hazards and providing the geological hazards as the seismic hazards. The system where the input data is on a single file on a computer readable medium and contains a description of building attributes. The system where the computer system is further configured to analyze a plurality of buildings within a building portfolio. The system where the computer system further configured to define mitigation plans for each building in the portfolio, and determine risk quantifiers for a plurality of time segments for each building in the portfolio. Implementations of the described techniques may include hardware, a method or process, or computer software on a computer-accessible medium.

One general aspect includes the system where the computer system is further configured to determine a total risk by summing the risk quantifiers for each time segment. Other embodiments of this aspect include corresponding computer systems, apparatus, and computer programs recorded on one or more computer storage devices, each configured to perform the actions of the methods.

Implementations may include one or more of the following features. The system where the computer system is further configured to output a representation of the total risk. The system may also include Implementations of the described techniques may include hardware, a method or process, or computer software on a computer-accessible medium.

BRIEF DESCRIPTION OF THE DRAWINGS

A preferred embodiment of the present invention will now be specified in detail with reference to the drawings.

DESCRIPTION OF EXEMPLARY EMBODIMENTS

As a result of the limitations of existing seismic risk assessment methods as describe above, building owners lack the systems to implement informed decisions relating to actions that actively target building-specific risk-reduction goals by considering all mitigation solutions, including those that may be missed if code-prescriptive design approaches are followed. This can lead to lower return on investment (ROI) for capital spending on seismic upgrades and risk management, and can discourage building owners from taking steps to lower seismic risk due to the unclear outcomes of their actions. Accordingly, there is a need for improved systems and methods for the design of building structures that accommodate risk assessment beyond extreme damage. In practice this is known as Catastrophe Modeling Software (CAT modeling).

Commercial examples of CAT modeling software providers include RMS, EQCAT and AIR. One example of risk assessment method based on a CAT model is described by "Computer System Method for Determining an Earthquake Impact" (US Patent Publication No. 2011/0196810). Typically, a portfolio of structures is described in a database by their specific location, building attributes such as year built, type of construction, number of stories, other optional modifiers such as whether the building meets code requirements and fragility functions which describe the likelihood of reaching a certain damage state at a given earthquake intensity. In an assessment, an earthquake intensity measure (IM) is generated either by a stored equation or based on historical data, and the IM is used to calculate the likelihood of each building reaching a given damage state from the fragility functions. Once the damage state is determined, a loss value is calculated, and the results are summed up for all buildings in a portfolio to determine the total loss. Since the buildings are described by a set of general attributes, prior art CAT model-based assessments can only provide loss estimates and suggest mitigation actions based on the same set of attributes. As a result, the outcomes of prior art CAT models do not correspond to the actual loss experienced by any specific property, and therefore cannot extend to the design of specific building structures or improvements to specific building structures themselves.

Figure 1:
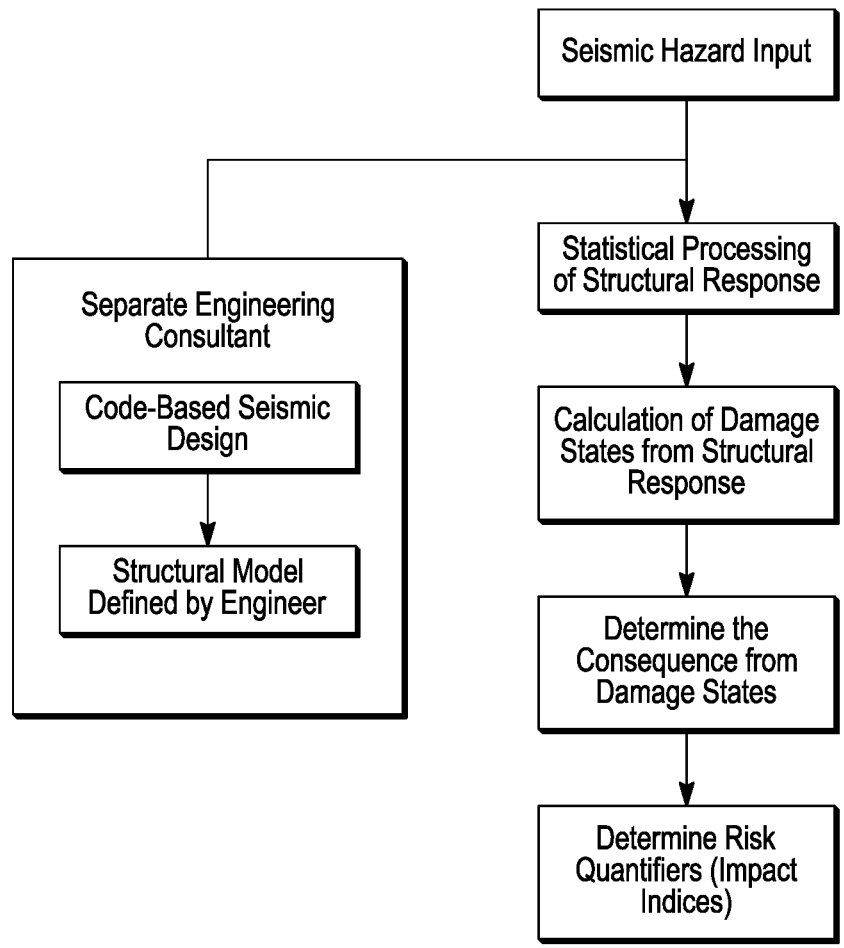
FIG. 1 shows a prior art method.

To overcome this limitation, a published building-specific seismic loss analysis methodology known as the FEMA P58 methodology was formulated in a way that recognizes the effect of individual components and their position and configuration have on the seismic loss experienced by any given property. This methodology has been implemented in a tool called PACT by FEMA, as well as in an existing commercial web-based tool called Seismic Performance Prediction Program (SP3) by HBRisk Group. The typical process for this type of assessment is illustrated in FIG. 1. In a FEMA P58 assessment, the earthquake hazard as well as the building damageable contents, and population models are first defined. Then a structural engineer, who does not necessarily perform the risk assessment, has to design the structure or in the case of a retrofit, investigate the state of the structure, build a structural model, and evaluate the engineering demand parameters (EDPs), which are building response quantities that are directly related to damage. The statistical properties of the EDPs thus computed are then used to calibrate an assumed lognormal joint probability distribution. In the implemented version of the FEMA P58 method, this joint probability distribution is used to generate random samples of EDPs used to determine the damage state for each building component using a stored database of component fragility functions. Once the damage states for all components are found, a stored database of consequence functions that relate damage states to repair costs, safety hazards and repair time are used to generate the total repair cost, repair time and safety hazards of the realization. This process is repeated many times using different random samples of EDPs to produce a probabilistic description of the seismic risk for the given building. Although the FEMA P58 procedure can reveal building-specific risk that are not possible with a CAT model, it falls short in terms of mitigation of risk as the method alone does not provide enough information for stakeholders to determine the best risk mitigation options, and must rely on conventional seismic design procedure to come up with structural solutions which will be assessed subsequently. The development of such random samples and production of the probabilistic description are extremely computer processor intensive, both in terms of computing resources required and time to run these computations to arrive at an acceptable output. However, even when the FEMA P58 is used, the prescriptive nature of the seismic design practice may converge to sub-optimal solutions and completely miss more cost-effective strategies.

The present invention provides for an integrated system and method for combining a statistical structural response prediction process suitable for conventional structural systems and non-conventional high-performance seismic structural systems, with a probabilistic seismic hazard module and a seismic loss analysis module to generate building-specific risk mitigation guide maps that relate risk, expressed as quantifiable earthquake impact indices, to numeric parameters that describe the cost, implementation and design requirements, without the need to engage a structural engineering consultant for design and analysis. Furthermore, the invention includes a risk assessment method for large multi-building portfolios based on converting the probabilistic building-specific risk measures into a form suitable for portfolio analysis. This method enables the cost-benefit evaluation of the portfolio for different courses of action that introduce mitigation measures to different groups of buildings at different times. The present invention provides computer implementations of sub-methods which make up the components of the integrated method for generating risk mitigation guide maps for individual buildings and portfolios. The guide maps thus generated can be presented in many forms (tables, surface plots, lists, contours) to relate different impact quantifiers to different cost and design parameters for decision-support at the onset of the project, prior to the start of engineering design.

Herein, numerous specific details are set forth in order to provide a thorough understanding of the exemplary embodiments described. However, it will be understood by those of ordinary skill in the art that the embodiments described herein may be practiced without these specific details. In other instances, well-known methods, procedures and components have not been described in detail so as not to obscure the embodiments generally described herein. Furthermore, this description is not to be considered as limiting the scope of the embodiments described herein in any way, but rather as merely describing the implementation of various embodiments as presented here for illustration.

The embodiments of the systems and methods described herein may be implemented in hardware or software, or a combination of both. These embodiments may be implemented in computer programs executing on programmable computers, each computer including at least one processor, a data storage system (including volatile memory or non-volatile memory or other data storage elements or a combination thereof), and at least one communication interface. In certain embodiments, the computer may be a digital or any analogue computer.

Program code is applied to input data to perform the functions described herein and to generate output information. The output information is applied to one or more output devices, in known fashion.

Each program may be implemented in a high level procedural or object oriented programming or scripting language, or both, to communicate with a computer system. However, alternatively the programs may be implemented in assembly or machine language, if desired. The language may be a compiled or interpreted language. Each such computer program may be stored on a storage media or a device (e.g., read-only memory (ROM), magnetic disk, optical disc), readable by a general or special purpose programmable computer, for configuring and operating the computer when the storage media or device is read by the computer to perform the procedures described herein. Embodiments of the system may also be considered to be implemented as a non-transitory computer-readable storage medium, configured with a computer program, where the storage medium so configured causes a computer to operate in a specific and predefined manner to perform the functions described herein.

Furthermore, the systems and methods of the described embodiments are capable of being distributed in a computer program product including a physical, nontransitory computer readable medium that bears computer usable instructions for one or more processors. The medium may be provided in various forms, including one or more diskettes, compact disks, tapes, chips, magnetic and electronic storage media, and the like. Non-transitory computer-readable media comprise all computer-readable media, with the exception being a transitory, propagating signal. The term non-transitory is not intended to exclude computer readable media such as a volatile memory or random-access memory (RAM), where the data stored thereon is only temporarily stored. The computer useable instructions may also be in various forms, including compiled and non-compiled code.

Figure 2:
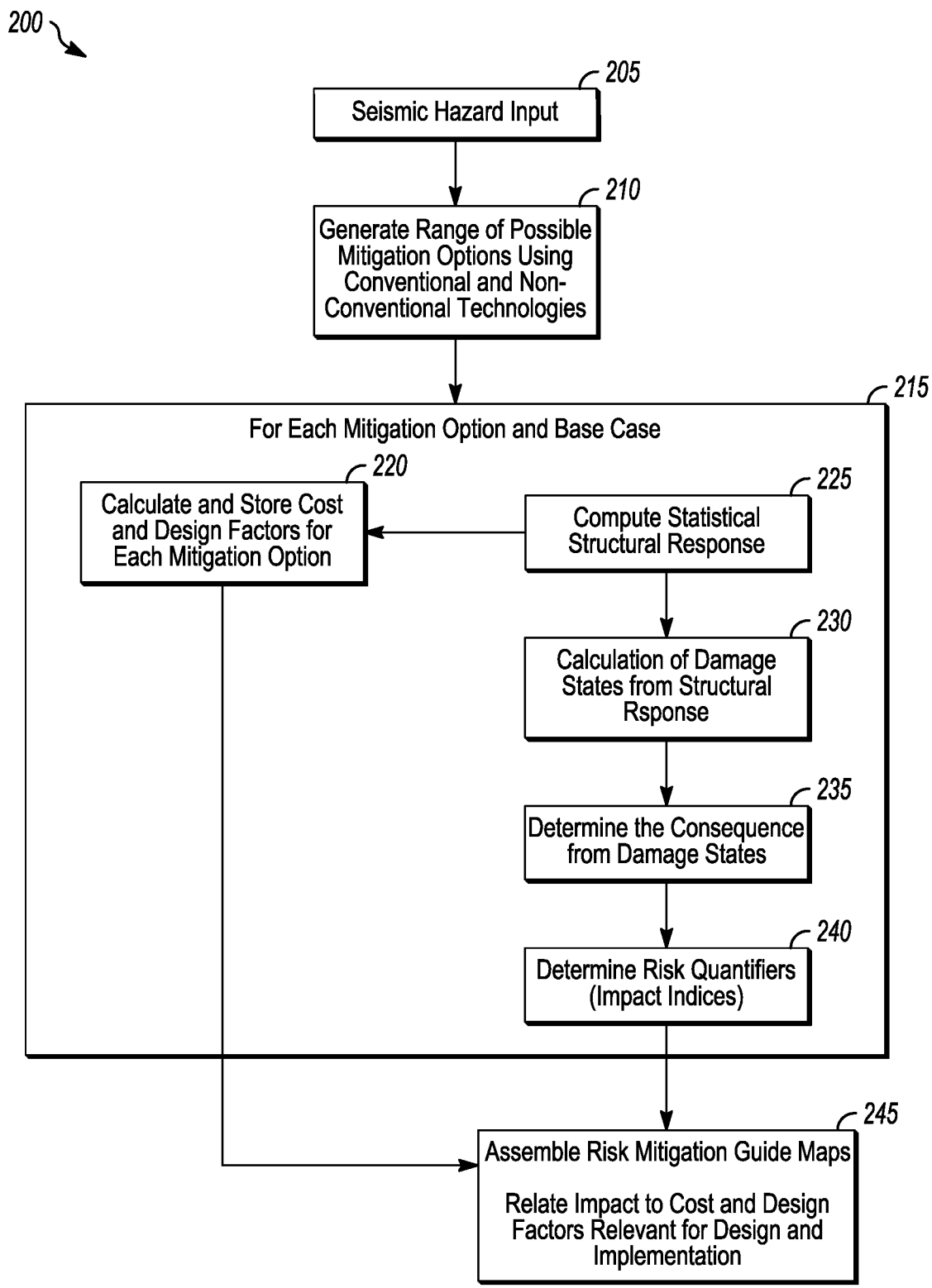
FIG. 2 is a flowchart showing a method according to one embodiment of the invention.

Turning now to FIG. 2, there is shown one embodiment of the invention relating to building-specific risk analysis for individual buildings. The method 200 of FIG. 2 includes a seismic providing a seismic hazard input 205 by a seismic hazard risk module implemented in software and automatically generating multiple feasible solutions that could be used to mitigate risk 210 by a seismic risk mitigation option generation module 210. Contrary to the existing assessment method where a separate process for design and analysis of a single proposed solution is required, the risk mitigation generation module can be used to automatically create different groups of risk-mitigation options that consider both conventional and non-conventional seismic protection technologies without performing any additional structural design and analysis activities. For each of these generated solutions 215 and the base case structural without mitigation, the statistical structural response is computed 225, from which quantitative factors relating to cost and design are computed 220. Also using the computed statistical structural response, a process similar to the existing building-specific seismic assessment is performed at steps 230, 235, 240 to determine the damage, and thus the impact factors, which quantitatively describe safety, financial and operational impacts of the building considered. The cost and design factors are then combined with the impact factors to create guide maps 245 for seismic risk mitigation that quantitatively describe the cost and benefits of each mitigation option for informed decision-making prior to the onset of elaborate design and implementation activities.

Figure 3:
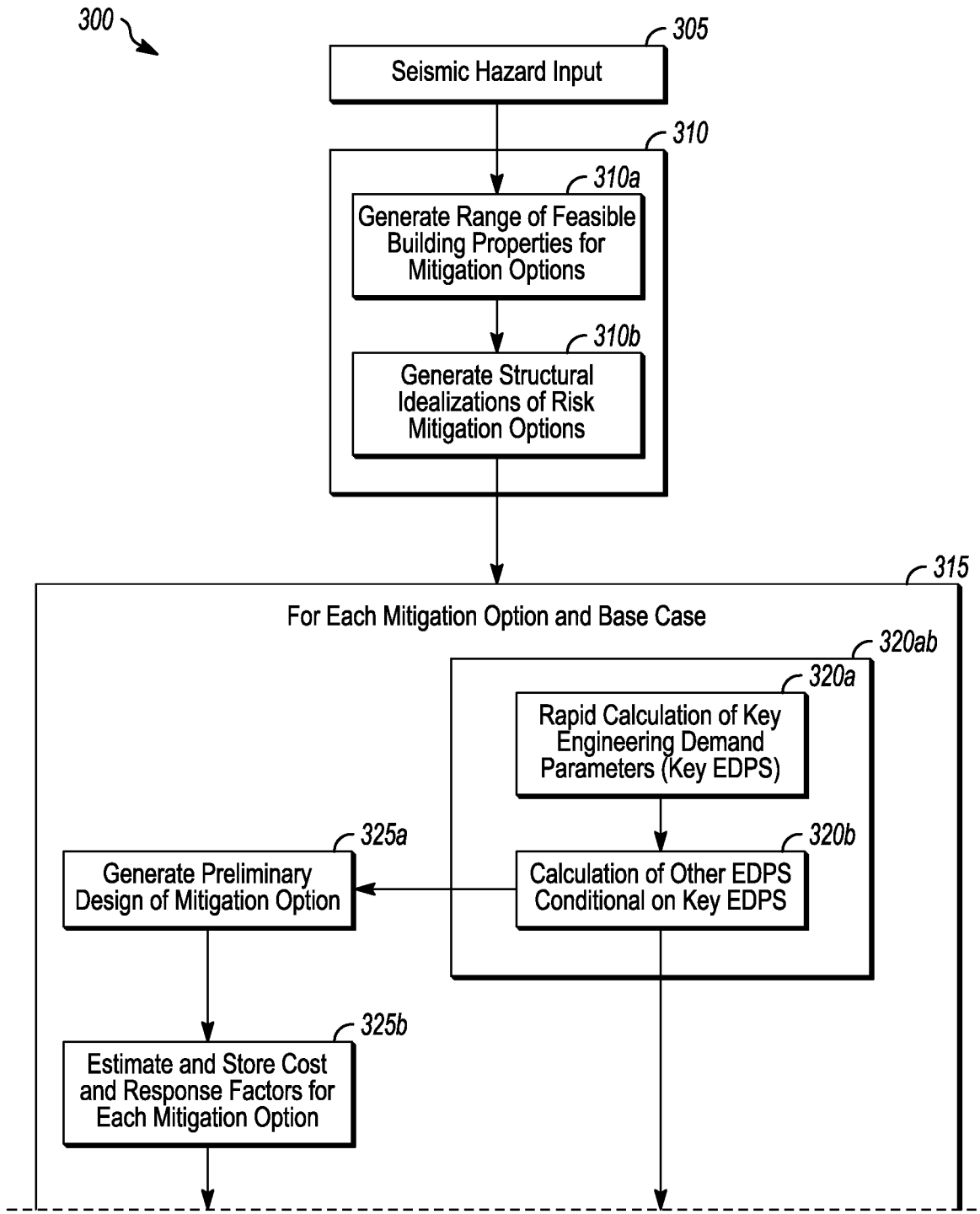
FIG. 3 is a flowchart showing additional exemplary details of the method of FIG. 2
Figure 3:
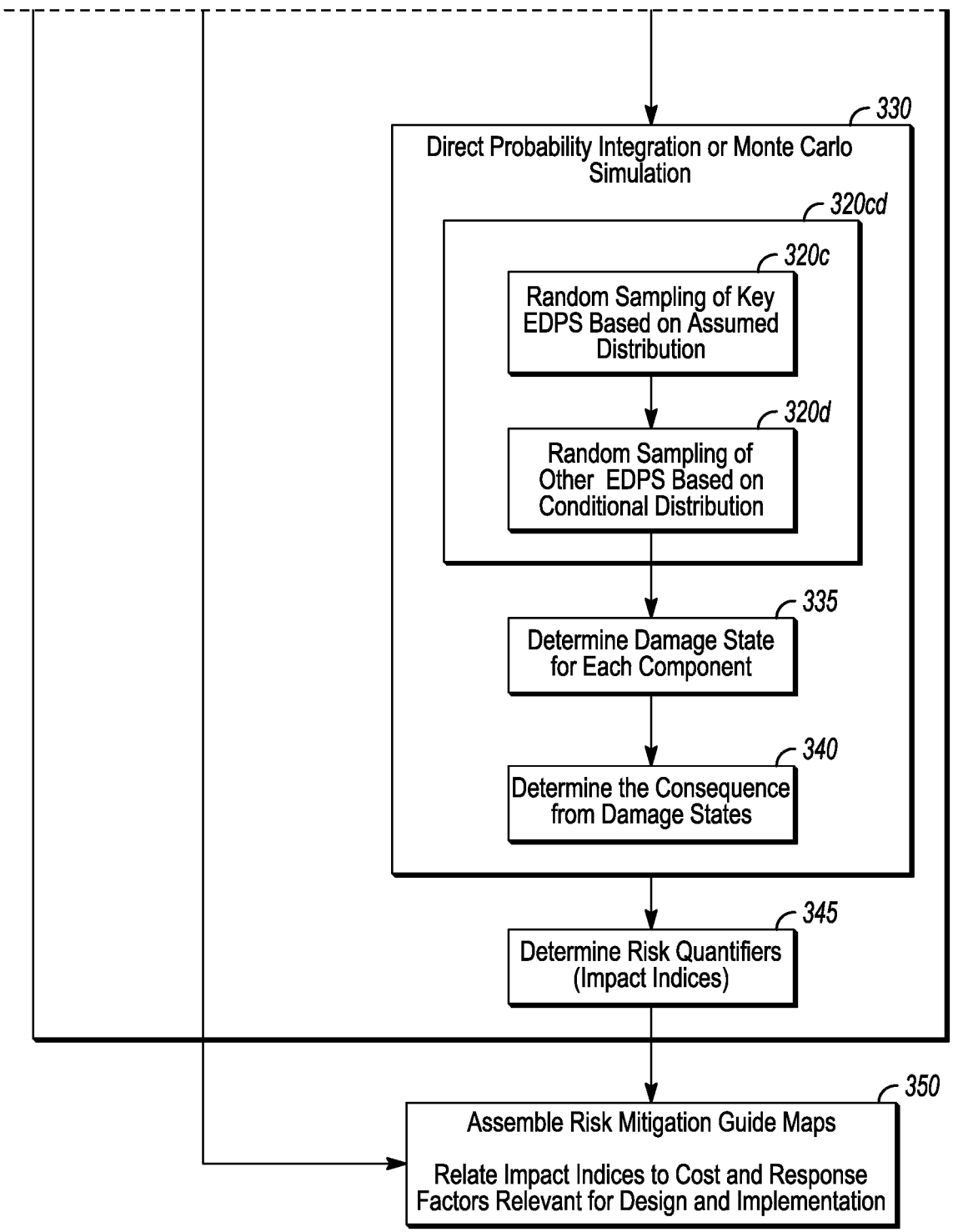

Turning now to FIG. 3, there is shown a more detailed breakdown of the method 300 according to an embodiment of the invention. proposed integrated method for individual buildings is described in FIG. 3. First, a seismic hazard model is defined by the user 305 based on the location of the building, and it is used to compute the intensity measures of interest, and possibly to determine the ground motion suites used for response-history analysis. Compared to prior art approaches, an automatic process is provided for generating risk mitigation options using both conventional seismic resistant building systems and non-conventional high-performance seismic resistant building systems prior to the risk analysis. This process 310 defines ranges of key feasible structural attributes 310a, and through a special transformation process, each combination of attributes is converted into an idealized structure, representing one possible risk mitigation option, with automatically computed structural properties that enable the calculation of engineering demand parameters (building response parameters that are directly related to damage) given the seismic hazard 310b. For each risk mitigation option 315, key engineering demand parameters (EDPs), from which the values of other EDPs can be derived, are first computed along with a probability distribution conditioned on the seismic hazard 320a. Then, using the computed values of key EDPs, the values of the other EDPs are subsequently computed 320b. Using the computed EDPs and structural parameters of the risk mitigation option, a preliminary design of the mitigation solution is generated 325a and numeric factors relating to cost, design and implementation requirements are estimated and stored 325b. These factors include, but are not limited to the required existing foundation capacity, the required structural weight, approximate structural cost, and ratios of anticipated response versus code-requirement. For each risk mitigation option generated, a building-specific loss analysis is performed, in a manner similar to the prior art. However, a more general process of sampling EDP values that accounts for non-lognormally distributed EDPs is used. In this process, the probability distribution of key EDPs are used to first generate random samples of key EDPs for loss analysis 320c. The sampled values of key EDPs are then used to determine EDP-specific conditional distributions that are used for the subsequent sampling of other EDPs 320d. The generated EDP realizations are then used to compute the component damage states 335, damage consequences 340 and finally, impact indices of the building 345. Finally, the assessment results 350 are combined with the cost and design factors 325b for each risk mitigation option to create risk mitigation guide maps that compactly illustrate the risk impacts of different mitigation options. These guide maps are generated automatically based only on predefined ranges of structural attributes and seismic hazards, which are readily determined from either stored analytical equations or data. Furthermore, a preliminary design is immediately available 325a for all the solutions on the guide map which can be used by structural engineers for detailed design and implementation.

Figure 4A:
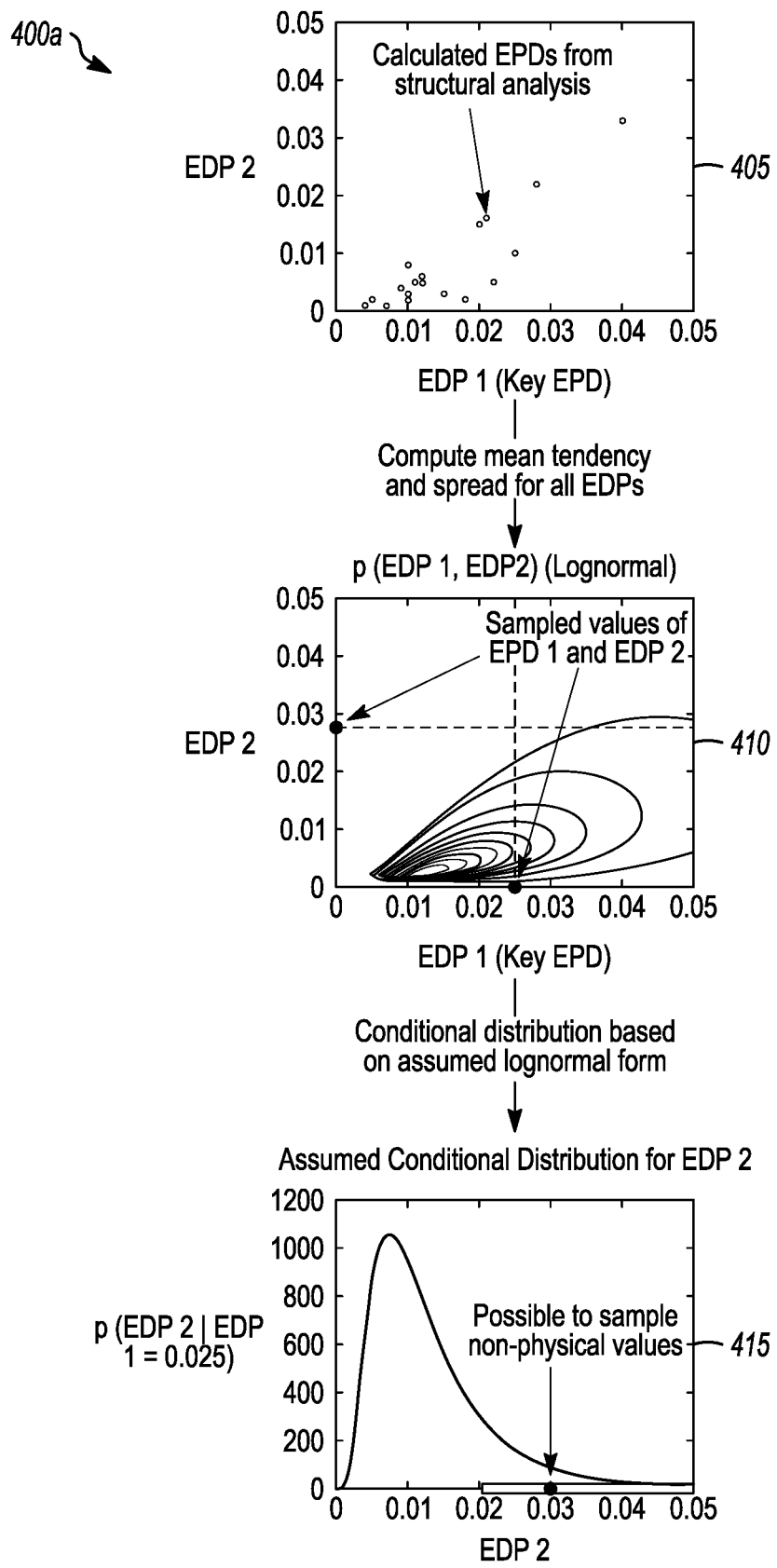
FIGS. 4A and 4B show a comparison of the engineering demand parameter (EDP) output of the prior art method and the method of the present invention.

In the present invention, EDP generation and sampling process for probabilistic risk assessment differs from existing building-specific assessment methods which assume that the joint distribution of EDPs is a multivariate lognormal distribution. This can be a poor assumption for some EDPs, which can lead to non-physical results and even significant errors in the calculation of losses and downtime. FIG. 4a shows the key process in the prior art method 400 using an example with two EDPs. The procedure starts with a set of computed EDPs from structural analysis 405. Quantities that describe the statistical mean tendency and spread are computed. Using these statistical quantities, a multivariate (in this case bivariate) lognormal distribution is defined, as depicted in the contour 410. When sampling EDPs for loss analysis, the bivariate lognormal distribution is summoned directly and random samples of each EDP are obtained simultaneously. Since a joint lognormal distribution is assumed, the conditional distributions of any EDP conditioned on other EDP(s) are also lognormal. This is generally acceptable for structural parameters such as building drifts and accelerations. However, it is not an accurate assumption for every structural response quantity. As shown at 415, there could be values that are not possible for some EDPs, and a lognormal sample realization of an EDP that does not obey the lognormal distribution can result in a non-physical value and large errors in the loss assessment. One example of an EDP that does not follow the lognormal distribution is the building residual drift distribution (the permanent deformation that remains in a damaged building after an earthquake) conditioned on a peak story drift. By definition, the residual drift cannot be larger than the peak drift and its value tends to concentrate at certain fractions of the peak drift that depend on the ability of the structure to re-center itself. However, these features cannot be reproduced from a lognormal conditional residual drift distribution and there is a finite probability that physically impossible residual drifts are sampled. Since small differences in the residual drift can lead to drastic changes in loss, assuming an inappropriate probability distribution can have a significant impact on the accuracy of the loss assessment.

Figure 4B:
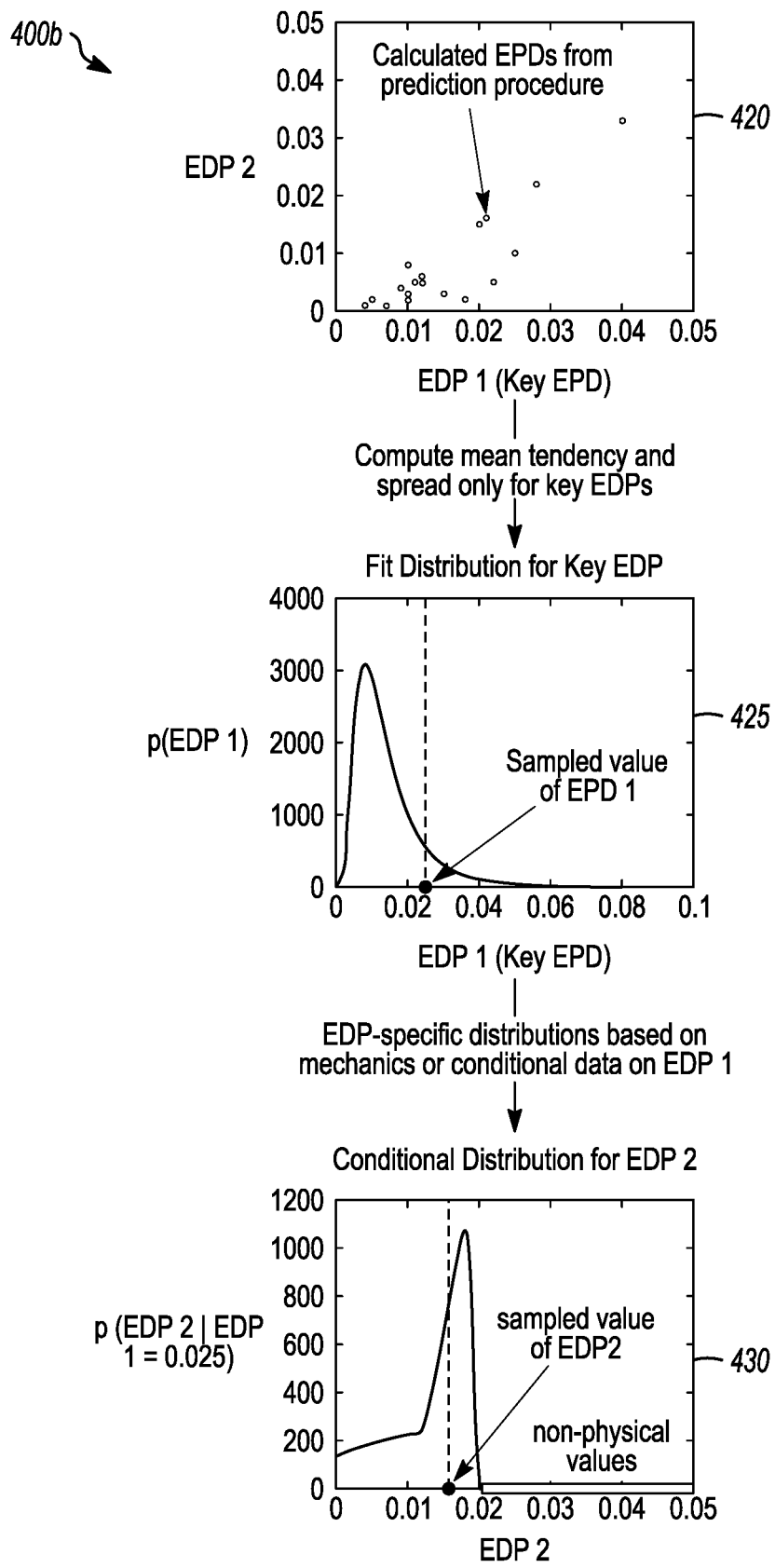

In the EDP generation and sampling process of the present invention, instead of assuming that all EDPs obey a joint lognormal distribution, EDPs are classified as primary (or key) EDPs, and secondary (or other) EDPs with a separate statistical treatment adopted for each. The mean tendency and spreads of key EDPs are calculated by the structural response prediction procedure as in FIGS. 2 and 3. The joint distribution of key EDPs is determined by best-fit using probabilistic distributions that are not constrained to being lognormal. The joint distribution as determined is used to sample random key EDP values for seismic loss analysis. Where the procedure differs from the prior art is that the statistical sampling of other EDPs are based on EDP-specific conditional distributions that are either derived from engineering mechanics using the sampled key EDP values and stored in a computer database, or based on empirical distribution derived from a stored database of EDP values conditioned on the value of suitable key EDP(s). In the example with two EDPs shown in FIG. 4b, starting with predicted values of key EDP (EDP 1) from the response prediction procedure 420, a single variate distribution for EDP 1 is determined by best-fit. Sampling 425 is performed based on the fitted distribution to determine the sample realization of EDP 1. Using this particular value of EDP 1, either an engineering mechanics-based analytical calculation or fitting of data conditioned on the value of EDP 1 is used to establish the conditional distribution of EDP 2 430, which is used to sample EDP 2. This process better models the probability of non-lognormally distributed EDPs, and hence leads to a more realistic loss analysis than the existing procedure.

According to the present invention, impact indices are generated for a specific site, for a specific structure, and for different seismic risk mitigation options that may be sufficiently described by a set of simple structural attributes that enables transformation into an idealized structure used for response prediction. These mitigation options include but are not limited to auxiliary energy dissipation devices, seismic isolation, rocking mechanism, ductility enhancements, conventional strengthening or weakening, conventional stiffening or softening. Depending on the embodiment, the present invention can generate impact indices defined by financial loss, downtime, injury, death at one or multiple seismic intensities or return periods of interest, and over a user-defined period of time. The impact indices may also be derivatives and combinations of the above.

Structural attributes of candidate risk mitigation solutions are transformed into an idealized structure, which is then used to predict the key EDPs based on the earthquake hazard defined previously. In one embodiment, the seismic hazards may be defined as spectral accelerations at different periods and damping for predetermined range of earthquake intensities, analysis time period or seismic events. In this case, the expected values of the key EDPs are determined by combining the nonlinear primary mode response obtained by a solving an internally stored set of equations (simplified procedure), with corrections for higher mode contributions. Then, uncertainties (epistemic and aleatoric) of the key EDPs, which are obtained directly from an internally developed and stored database, are used to develop a joint probabilistic density function for key EDPs.

In other embodiments, the seismic hazard may be defined as one or multiple suites of ground motions representing the earthquake intensities. Both the said simplified procedure or direct nonlinear time-history analysis using the ground motions may be used to obtain the key EDPs. In this case, the response-history analysis results and the internally tabulated values of uncertainties are both used to compute the total uncertainty. A joint probability distribution for the key EDPs is then developed.

If the user is interested in an assessment only (no risk mitigation), steps 310 and 315 in FIG. 3 would apply to the building as is, and steps 325a and 325b will be eliminated.

The building-specific risk results obtained for individual buildings as described above can be converted into a form that enables more accurate multi-building portfolio risk analysis compared to CAT models. Specifically, the impact indices of interest (e.g. dollar loss, casualty, downtime) obtained from the individual building analysis can be used to derive the "building-specific impact functions", which are probability distributions of the impact indices conditioned on a seismic intensity measure generated for each building site in a multi-building portfolio. In a portfolio analysis, the seismic intensity measures are generated for all buildings in the portfolio, and the value of the intensity measure at each building site is used to directly compute the impact indices of the corresponding building using the building-specific impact functions. This is contrasted with the CAT model approach where the intensity measure at each site are used to determine the losses through relatively crude vulnerability functions that are defined based on generic building attributes. The portfolio analysis using impact functions can incorporate all buildings in a portfolio or only a subset of buildings, depending on the purpose of the analysis. If there are many similar buildings within a portfolio (e.g. schools, fire halls, strip malls), the impact functions can be transferred, which enables efficient and accurate assessments of large building portfolios. Furthermore, building-specific impact functions for different mitigation options as determined in the individual building analysis can be used to model the benefits of introducing the said mitigation option at different points in time for different buildings.

Figure 5:
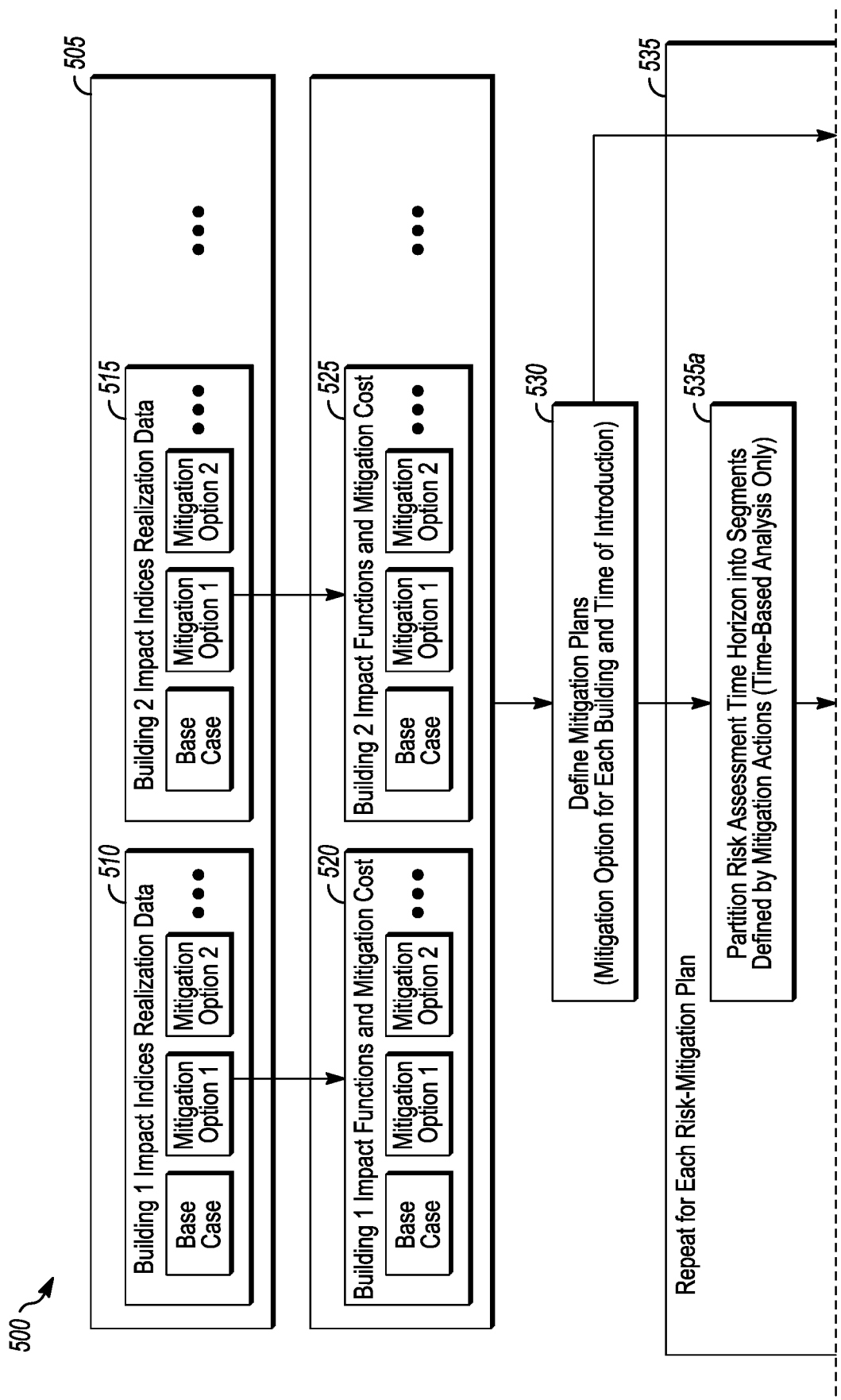
FIG. 5 is a flowchart showing the method of the invention applied to a portfolio of buildings.
Figure 5:
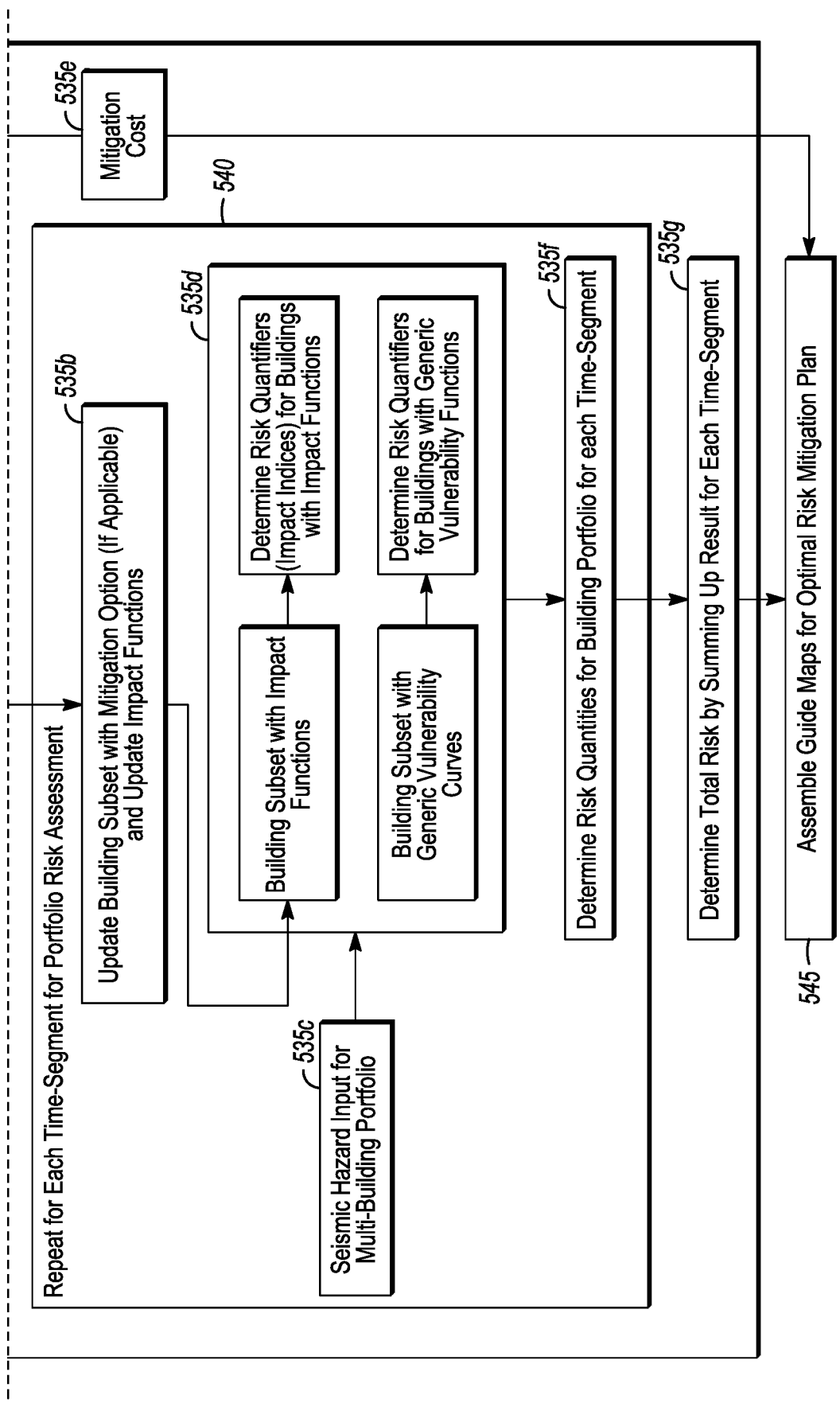

FIG. 5 illustrates a process 500 of portfolio analysis using impact functions derived from the results of individual building-specific analyses as herein described. To begin the portfolio analysis, building-specific risk results containing computed impact indices for each realization 510, 515 are used to fit impact functions 520, 525, which are conditional probability distribution functions of the impact indices given a site-specific earthquake intensity measure (e.g. spectral acceleration). This process is repeated for the base building and different mitigation options for that building (if applicable). At the end of steps 520, 525, impact functions for the base buildings and different mitigation options are generated for each building in the portfolio for which a building-specific risk analysis described above has been performed. Impact functions allow the direct probabilistic mapping of earthquake intensity measures to the impact indices, without having to relate to intermediate variables such as EDPs and damage states. At step 530, mitigation plans, which introduce mitigation options to specific buildings at specific points of time in a given time frame of analysis, are developed as part of the user input using cost and performance metric data from the mitigation guide maps obtained from the individual building analysis. The mitigation plans are stored internally and assessed individual at step 535. For time-based portfolio analysis where risk mitigation measures are introduced at different points in time, step 535a is first executed to partition the time frame of analysis into finite segments corresponding to the times at which a mitigation measure is introduced in the mitigation plan. If all mitigation measure in a mitigation plan are introduced simultaneously, the partition will simply contain the entire time frame. For other types of analysis where time is not an explicit variable, 535a is not required and all risk mitigation measures in a risk mitigation plan will be introduced at once. For each time partition, step 535b updates the building portfolio with mitigation measures introduced by the mitigation plan by replacing the original impact functions with the impact functions derived from the building with mitigation measure. Step 535c generates a field of seismic hazard intensity measures for each building site in the portfolio. The earthquake generation can be stochastic or deterministic in nature, either with or without spatial correlations or interevent correlation. Step 535d performs the portfolio risk assessment by determining the impact indices for each building using the site-specific seismic intensity measures by either Monte Carlo simulation or direct integration of probability distribution functions. In Step 535d, the impact indices for buildings with impact functions are computed using impact functions. For buildings without impact functions, the less accurate vulnerability curves (obtained from a stored database of vulnerability curves) defined based on basic building attributes (e.g. height, number of stories, construction type) are used to map the seismic intensity measures to impact indices. The total impact indices from the subset of buildings with and without impact functions are summed in 535f to determine the portfolio risk. For time-based analysis, an additional step 535g is required to sum up the results for each time segments. Finally, the cost of each mitigation plan is drawn from in step 535e, and together with the portfolio risk results for each mitigation plan, step 545 creates guide maps for decision-support.

Figure 6:
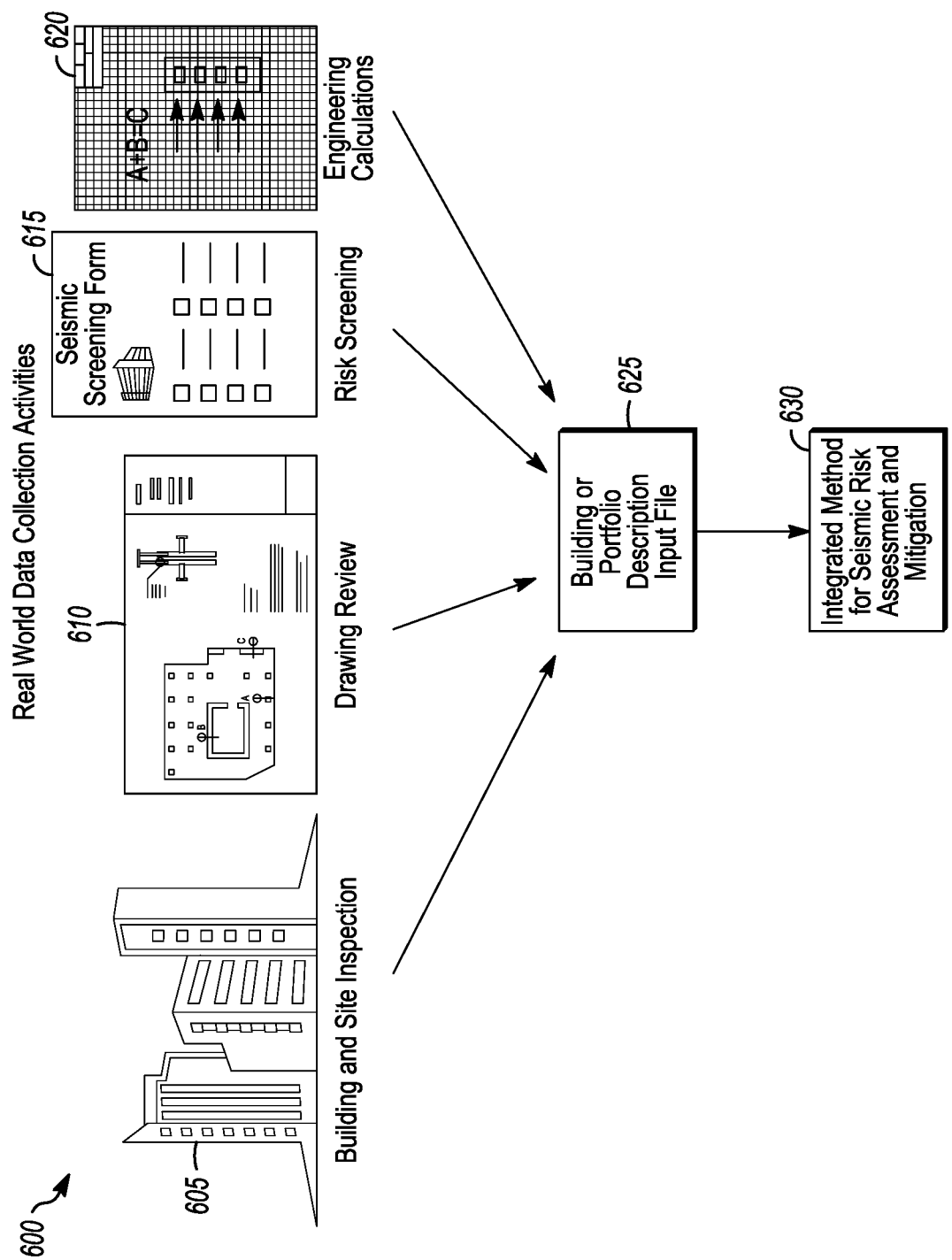
FIG. 6 shows data collection activities used as inputs to the method of FIGS. 2 and 3.

For both the individual building and multi-building portfolio analysis, some data collection and compilation are required in order to successfully generate risk guide maps or assessment results from the invention. Detailed structural study and drawing review may be required for highly complex or important structures. Site inspection and soil study may be required for buildings subjected to geological hazards such as liquefaction. The information collected on the building site and the building condition will be passed to an input file or a set of input files. In one embodiment, this could be a single file using a suitable format such as the JSON or XML, containing the description of building and portfolio attributes. In other embodiment, multiple files can be used to describe different aspects of the portfolio and building. The information contained in the input file enables the invention to define the appropriate seismic hazard, populate building content for risk assessment and identify mitigation options. FIG. 6 summarizes the interaction between the different examples of data collection and engineering activities 600. Inputs such as building and site inspection 605, engineering drawing review 610, risk screening 615 and engineering calculations 620 are provided to input file 625 and the method continues at step 630 (or into FIGS. 2 and/or 3).

Figure 7:
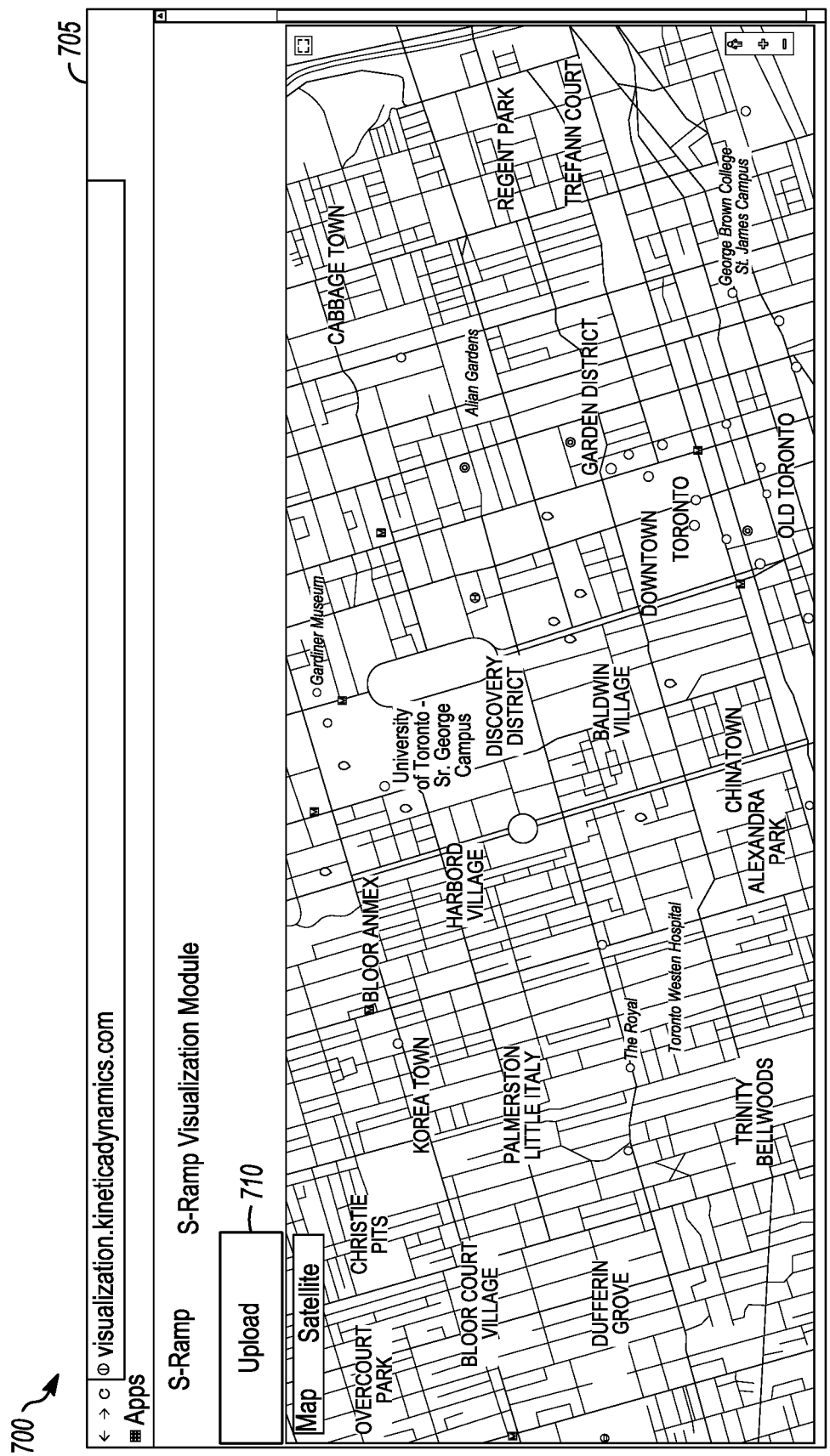
FIG. 7 and FIG. 8 show an implementation of the method and its output on a graphical user interface.
Figure 8:
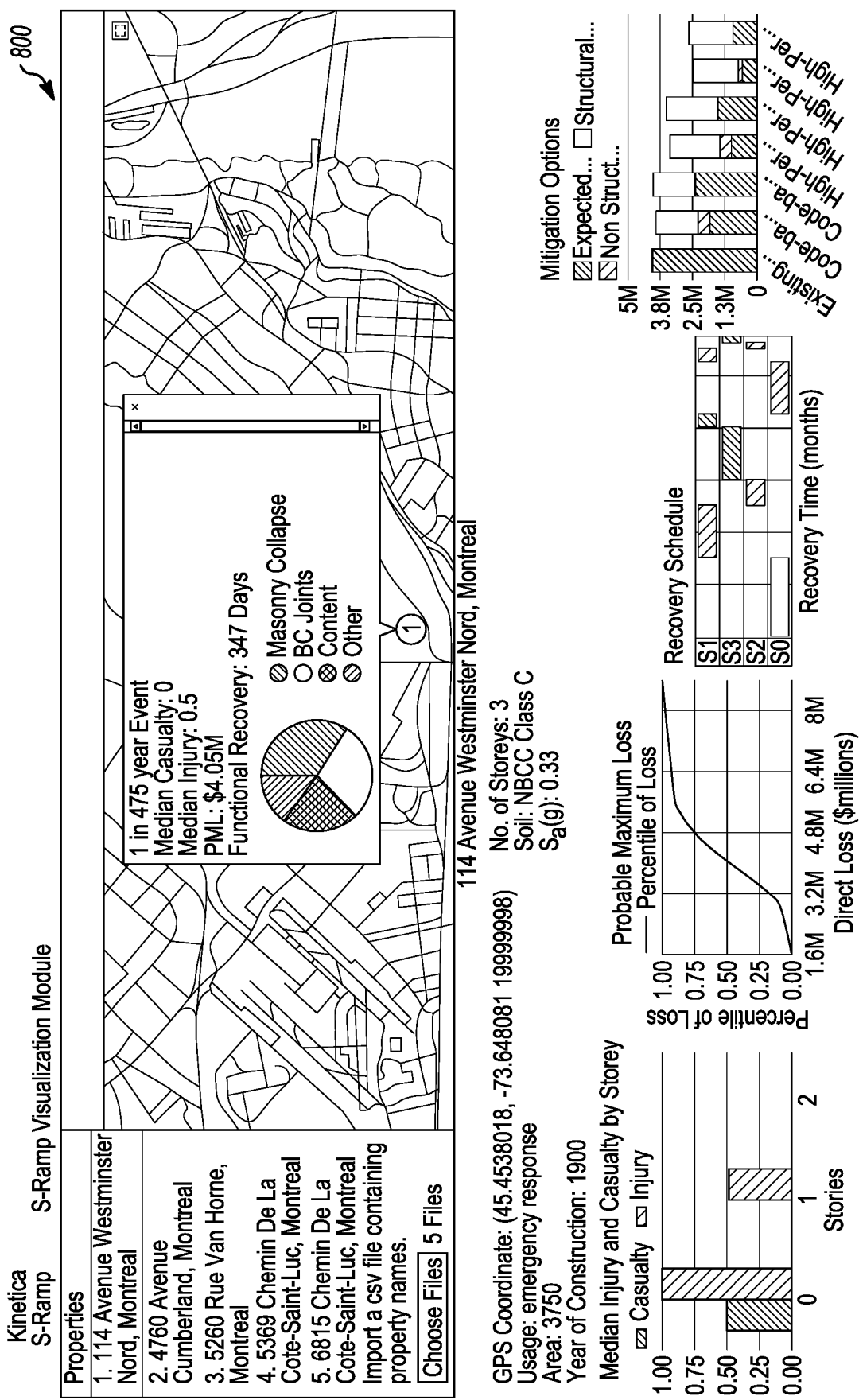

FIGS. 7 and 8 show simulated screenshots of an input file upload page 700 in an exemplary user interface of software implementing the invention, and the portfolio risk results from one implementation of the invention 800. As can be seen from FIGS. 7 and 8, once the inputs described in FIG. 6 have been gathered and otherwise defined, an "Upload" button 710 can be provided in software which triggers the execution of the method described in FIGS. 2 and 3 whereby results of carrying out the invention are provided following execution by a computer processor. The results may be displayed in terms of loss of life, direct loss in monetary damage of physical, non-human components within a building (this includes building-specific items, as well as physical items which happen to occupy space within a building), and recovery time which can then be correlated with a monetary loss due to business down-time, etc.

As will now be appreciated by one skilled in the art, the invention provides for a method and system which cost-efficiently and quickly generates structural solutions for mitigating seismic risk without engaging the typical structural design and analysis processes. That is, the outputs of the invention provide for an enhanced structural design process whereby specific building structures can be design based on known risk parameters, rather than merely simulating risk parameters based on already-known designs. The latter approach requires complete building design to be processed, which is a slow process and occupies unnecessarily high computing resources.

The invention further generates risk mitigation solutions using both conventional and non-conventional high-performance earthquake resistant technologies permitted by the building codes, and quantitatively presents the cost and benefit of all generated risk mitigation options.

In addition, the invention enables rapid evaluation of the best courses of actions at the onset of seismic design or upgrade projects by quantifying risks that have direct impact on the stakeholder's interest.

Beyond singled building analysis, the invention enables efficient and accurate evaluation of multi-building portfolio risk exposure using impact functions and allows for explicit evaluation and optimization of portfolio risk mitigation plans implemented over time (incremental risk mitigation).

Finally, preferably user interfaces display the performance of large numbers of seismic risk mitigation solutions in graphical form for decision maker and automatically generates preliminary design for the identified risk mitigation solution(s). The invention further provides a novel procedure for generating structural responses, and hence seismic losses, that allows for prediction of general EDPs that do not necessarily follow the lognormal distribution.

The invention can be used for a variety of purposes to aid the computer determination of property seismic risk for use in building design. Some of the advantages that may be provided by the invention include the ability to accurately assess quantifiable property-specific financial, downtime, safety and other operational impacts due to earthquake for long-term maintenance and risk management plans; performs rapid and high accuracy risk assessment and mitigation analysis; in multi-property portfolio analysis, permits quantitative assessment and optimization options of incremental risk mitigation over a period of time; identifies the breakdown of components that contribute to the overall building seismic risk to identify cost-effective solutions that may be different from other existing guidelines based only on achieving code-based life-safety performance; identifies the breakdown of building properties that contribute to the overall portfolio seismic risk; permits the prioritization and allocation of limited temporal, financial and human resources to manage seismic risk based on a multifaceted seismic impact analysis; enables stakeholders to review cost-benefits of different courses of action that encompasses all mature seismic protection technologies prior to engaging engineers for design. This allows stakeholders to compare and select the best option that targets the mitigation of chosen risk quantifier(s) at a relatively small cost, without relying on the much more expensive, and often ineffective prescriptive code-based seismic design.

Other advantages may include the construction of rational, and quantitative arguments for justifying various degrees of seismic risk mitigation interventions, by providing decision makes with relevant data; promotes the widespread use of cost-effective seismic protection technologies by enabling the building of business cases based on rational and quantitative cost-benefit analysis; enables owners and developers to realize upfront cost-savings relative to existing prescriptive code-based approach that relies heavily on conventional seismic resistant structural design; enables owners and stakeholders to obtain better and more rationally developed insurance policies; enables owners and stakeholders to actively reduce earthquake direct and indirect losses; promotes a safer and more seismic resilient building environment and society that resists damage and quickly recovers from seismic events.

The aforementioned embodiments have been described by way of example only. The invention is not to be considered limiting by these examples and is defined by the claims that now follow.

The invention claimed is:

1. A method for seismic loss assessment comprising:
  receiving by a computer system computer-readable input data regarding a seismic hazard and building conditions;
  generating by the computer system one or more mitigation options;
  for each of said mitigation options, configuring the computer system to:
    determine a structural response;
    determine damage states from said structural response;
    determine an outcome of each of said damage states; and,
    output a representation of each of said outcomes for each of said damage states;
    using said output representation in a seismic risk mitigation design for one or more building structures;
  wherein said step of generating one or more mitigation options comprises generating a range of feasible building properties and generating representative structural attributes of risk mitigation options.

2. The method of claim 1, wherein said representation of each of said outcomes comprises a data representation of risk quantifiers.

3. The method of claim 2, wherein the computer system is further configured to output at least one risk mitigation guide map summarizing an effect of each of said risk quantifiers for each said one or more building structures.

4. The method of claim 3, further comprising calculating and storing cost and design data points for each of said mitigation options and relating said risk identifiers to said cost and design data points for said using step.

5. The method of claim 1, wherein the computer system configured to determine a structural response comprises a configuration to determine primary engineering demand parameters and to calculate secondary engineering demand parameters conditional on the primary engineering demand parameters.

6. The method of claim 1, wherein the computer system configured to determine a damage state for said structural response comprises a configuration to determine a damage state for a plurality of components within the building structure; and the configuration to determine the outcome of each damage state considers the damage state of each of said plurality of components.

7. The method of claim 5, wherein the determination of primary engineering demand parameters is determined by best-fit using unconstrained probabilistic distributions.

8. The method of claim 1, further comprising repeating the method steps for a plurality of buildings within a building portfolio.

9. The method of claim 8, further defining mitigation plans for each building in said portfolio, and determining risk quantifiers for a plurality of time segments for each building in said portfolio.

10. The method of claim 9, further comprising determining a total risk by summing the risk quantifiers for each time segment.

11. The method of claim 10, further comprising outputting a representation of said total risk with cost-benefit metrics.

12. A system for seismic loss assessment comprising:
  computer-readable input data regarding a seismic hazard;
  a computer system for generating one or more mitigation options;
  said computer system configured to, for each of said mitigation options,
    determine a structural response;
    determine damage states from said structural response;
    determine an outcome of each of said damage states; and,
    output a representation of each of said outcomes for each of said damage states;
  wherein said generating one or more mitigation options comprises generating a range of feasible building properties and generating representative structural attributes of risk mitigation options.

13. The system of claim 12, wherein said representation of each of said outcomes comprises a data representation of risk quantifiers.

14. The system of claim 13, wherein the computer system is further configured to output at least one risk mitigation guide map summarizing an effect of each of said risk quantifiers for each said one or more building structures.

15. The system of claim 14, wherein the computer system is further configured to calculate and store on a computer readable cost estimate and design data points for each of said mitigation options and to relate said risk identifiers to said cost and design data points.

16. The system of claim 12, wherein the computer system configured to determine a structural response comprises a configuration to determine primary engineering demand parameters and to calculate secondary engineering demand parameters conditional on the primary engineering demand parameters.

17. The system of claim 12, wherein the computer system configured to determine a damage state for said structural response comprises a configuration to determine a damage state for a plurality of components within the building structure; and the configuration to determine the outcome of each damage state considers the damage state of each of said plurality of components.

18. The system of claim 17, wherein the determination of primary engineering demand parameters is determined by best-fit using unconstrained probabilistic distributions.

* * * * *